United States Patent
Harig et al.

(10) Patent No.: US 8,986,452 B2
(45) Date of Patent: Mar. 24, 2015

(54) COATING DEVICE AND COATING METHOD

(75) Inventors: Tino Harig, Langelsheim (DE); Markus Höfer, Gardessen (DE); Artur Laukart, Braunschweig (DE); Lothar Schäfer, Meine (DE); Markus Armgardt, Braunschweig (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 769 days.

(21) Appl. No.: 13/375,971

(22) PCT Filed: May 13, 2010

(86) PCT No.: PCT/EP2010/056625
§ 371 (c)(1),
(2), (4) Date: Dec. 20, 2011

(87) PCT Pub. No.: WO2010/139543
PCT Pub. Date: Dec. 9, 2010

(65) Prior Publication Data
US 2012/0100310 A1 Apr. 26, 2012

(30) Foreign Application Priority Data
Jun. 2, 2009 (DE) .......................... 10 2009 023 471

(51) Int. Cl.
*C23C 16/00* (2006.01)
*C23C 16/46* (2006.01)
(Continued)

(52) U.S. Cl.
CPC ............... *C23C 16/46* (2013.01); *C23C 16/24* (2013.01); *C23C 16/26* (2013.01); *C23C 16/27* (2013.01); *C23C 16/271* (2013.01); *C23C 16/28* (2013.01)

USPC ............................................. 118/722; 118/715

(58) Field of Classification Search
USPC ................................................... 118/722, 715
See application file for complete search history.

(56) References Cited

U.S. PATENT DOCUMENTS

| 8,052,795 B2 | 11/2011 | Kang et al. |
| 2004/0069231 A1 | 4/2004 | Chae ..................... 118/723 HC |

(Continued)

FOREIGN PATENT DOCUMENTS

| CN | 1844450 A | 10/2006 | .............. C23C 16/27 |
| CN | 1861839 A | 11/2006 | ............. C23C 16/448 |

(Continued)

OTHER PUBLICATIONS

Honda et al., Study of Silicidation Process of Tungsten Catalyzer during Silicon Film Deposition in Catalytic Chemical Vapor Deposition, 2008, pp. 3692-3698, vol. 47, No. 5, Japanese Journal of Applied Physics.

(Continued)

*Primary Examiner* — Keath Chen
(74) *Attorney, Agent, or Firm* — Brinks Gilson & Lione

(57) ABSTRACT

A coating installation containing at least one recipient which can be evacuated and which is adapted to accommodate a substrate, at least one gas supply device which is used to introduce at least one gaseous precursor into the recipient and at least one heatable activation element which has a definable longitudinal extension and which is fastened by means of at least one associated mechanical fastening device to be virtually immobile relative to the recipient. In a corresponding method, an electric current can be supplied to the activation element via at least two contact elements and at least one of the contact elements is designed to contact the activation element in alternating contact points.

18 Claims, 2 Drawing Sheets

(51) Int. Cl.
   *C23C 16/24* (2006.01)
   *C23C 16/26* (2006.01)
   *C23C 16/27* (2006.01)
   *C23C 16/28* (2006.01)

(56) References Cited

U.S. PATENT DOCUMENTS

| | | | |
|---|---|---|---|
| 2008/0035059 A1 | 2/2008 | Wang et al. | 118/723 HC |
| 2008/0047489 A1 | 2/2008 | Chung et al. | |
| 2008/0095937 A1 | 4/2008 | Richardson et al. | 427/255.24 |

FOREIGN PATENT DOCUMENTS

| | | | | |
|---|---|---|---|---|
| DE | 189 09 675 C 1 | | 11/1999 | |
| EP | 1 258 914 A1 | | 11/2002 | |
| EP | 2098608 A1 | | 9/2009 | C23C 14/04 |
| JP | 63-186763 | | 11/1988 | |
| JP | S63-186763 | * | 11/1988 | C23C 14/26 |
| JP | 04021777 A | | 1/1992 | |
| JP | 07254566 A | | 10/1995 | |
| JP | 2008140945 A | | 6/2008 | |
| JP | 2009-38398 A | | 2/2009 | |
| WO | WO 2010/139543 A1 | | 12/2010 | |

OTHER PUBLICATIONS

Frigeri, P.A. et al., Hot Wire Chemical Vapor Deposition: Limits and Opportunities of Protecting the Tungsten Catalyzer from Silicide with a Cavity, 2009, pp. 3428-3429, Elsevier.

Okoli, S. et al., Carburization of Tungsten and Tantalum Filaments During Low-Pressure Diamond Deposition, dated 1991, pp. 585-599, Surface and Coatings Technology.

Okoli, S. et al., Influence of the Filament Material on Low-Pressure Hot-Filament CVD Diamond Deposition, dated Sep. 1991, pp. C2-923-C2-930, vol. 1, Journal de Physique II.

Sommer, M. et al., Activity of Tungsten and Rhenium Filaments in $CH_4/H_2$ and $C_2H_2/H_2$ Mixtures: Importance for Diamond CVD, dated Nov. 1990, pp. 2433-2440, vol. 5, No. 11, J. Mater. Res.

Text of First Office Action re Chinese Patent Application No. 201080024586.5 relating to a coating device and a coating method.

Korean Office Action dtd Jun. 5, 2013—Notice of Preliminary Rejection.

* cited by examiner

COATING DEVICE AND COATING METHOD

BACKGROUND

The invention relates to a coating device, comprising at least one recipient, which can be evacuated and is intended for receiving a substrate, at least one gas supply device, by means of which at least one gaseous precursor can be introduced into the recipient, and at least one heatable activation element, which has a predeterminable longitudinal extent and is fastened almost immovably in relation to the recipient by means of at least one dedicated mechanical fastening device. The invention also relates to a corresponding coating method.

Coating devices of the type mentioned at the beginning are intended according to the prior art for coating a substrate by means of a hot-wire activated chemical vapor deposition. The deposited layers may, for example, comprise carbon, silicon or germanium. Correspondingly, the gaseous precursors may, for example, comprise methane, monosilane, monogermanium, ammonia or trimethylsilane.

K. Honda, K. Ohdaira and H. Matsumura, Jpn. J. App. Phys., Vol. 47, No. 5, discloses using a coating device of the type mentioned at the beginning for depositing silicon. For this purpose, silane ($SiH_4$) is supplied as a precursor by means of the gas supply device. According to the prior art, the precursor is disassociated and activated at the heated tungsten surface of an activation element, so that a layer of silicon or a layer comprising silicon can be deposited on a substrate.

However, a disadvantage of the cited prior art is that an undesired reaction of the material of the activation element with the precursor takes place, particularly at the colder clamping points of the activation element. For example, the use of a silane compound as a precursor may lead to the formation of silicide phases on the activation element.

The silicide phases occurring during the reaction generally lead to changes in volume of the activation element, are brittle in comparison with the starting material and cannot withstand such great mechanical forces, and they often exhibit a changed electrical resistance. This has the effect that the activation element is often already destroyed after being in operation for a few hours. For example, the activation element may be used under mechanical prestress in the recipient and rupture under the influence of this mechanical prestress. In order to prevent rupturing of the activation element under mechanical prestress, the prior art proposes flushing the clamping points with an inert gas. Although the prior art does show that the service life is extended to a limited extent, this is still insufficient when performing relatively long coating processes or for carrying out a number of shorter coating processes one directly after the other. Furthermore, the inert gas that is used influences the coating process.

The invention is consequently based on the object of extending the service life of an activation element in a coating device for hot-wire activated chemical vapor deposition without disadvantageously influencing the coating process. The object of the invention is also to increase the stability of the process and/or to simplify the control of the process.

SUMMARY

According to the invention, it is proposed in a way known per se to introduce a substrate to be coated into a recipient which can be evacuated. The recipient may, for example, consist of aluminum, high-grade steel, ceramic and/or glass. The recipient is closed off in a substantially airtight manner in a way known per se, for example by sealing elements of metal or polymer or by welded and soldered or brazed connections. The recipient may be evacuated by means of a vacuum pump.

At least one gaseous precursor with a predeterminable partial pressure is introduced into the recipient by way of a gas supply device. For example, the precursor may comprise methane, silanes, germaniums, ammonia, trimethylsilane, oxygen and/or hydrogen.

For the depositing of a layer, at least one activation element arranged in the space inside the recipient is heated. In particular, the heating of the activation element may be performed by electron-impact heating and/or electrical resistance heating. The activation element substantially comprises a refractory metal, such as for example molybdenum, niobium, tungsten or tantalum, or an alloy of these metals. In addition, the activation element may comprise further chemical elements, which either represent unavoidable impurities or, as an alloying constituent, adapt the properties of the activation element to the desired properties. The activation element may take the form of a wire, a plate, a tube, a cylinder and/or further, more complex geometries.

At the surface of the activation element, the molecules of the gaseous precursor are at least partially disassociated or excited. The excitation and/or disassociation may be enhanced by catalytic properties of the surface of the activation element. The molecules activated in this way reach the surface of the substrate, where they form the desired coating. In addition, molecules of the gaseous precursor may be at least partially reacted with the material of the activation element. Depending on the temperature of the activation element, the excitation and/or the disassociation and/or the reaction with the material of the activation element may be suppressed or accelerated.

In order to supply an electrical current to the activation element, at least two contact elements are provided, by means of which the activation element can be connected to an electrical current or voltage source. In an activation element with a homogeneous material composition and constant cross section, the thermal energy deposited when an electrical current flows through is introduced uniformly along the longitudinal extent.

On account of the increased thermal conductivity and/or the increased heat dissipation of the contact element, the activation element may have a lower temperature in a portion near the contact element, as compared with a portion at a greater distance from the contact element. In this case, the temperature of the activation element may fall so far in a portion near the contact element that the material of the activation element preferentially undergoes a chemical reaction with the precursor. For example, an activation element comprising tungsten may form a tungsten-silicide phase with a precursor comprising silicon.

To solve this problem, it is proposed according to the invention to contact the activation element by means of at least one movable contact element at changing contact points. In this way, shifting of the contact element is accompanied by a shifting of those points at which the activation element has a reduced temperature. As a result, the activation element does not undergo an undesired phase transformation or acceleration of such a phase transformation at the same place during the entire duration of the coating process. In some embodiments of the invention, an initially occurring undesired phase transformation, for example the formation of a carbide or silicide, can also be reversed again if the surface area or partial portion of the activation element that has been transformed in an undesired way is subsequently heated up to an elevated temperature. In this way, the lifetime of the activation element is increased as desired.

According to the invention, the formation of changing contact points is brought about by movement of the contact element, whereas the activation element remains immovable in relation to the surrounding recipient. In the sense of the present description, the activation element is also immovable whenever it undergoes a small change in length due to thermal expansion. According to the invention there is no movement of the activation element through movable fastening elements.

In some embodiments of the invention, an elongate activation element may have a greater length than the region used for activating the precursor. By displacing the contact elements, a respectively changing partial portion of the activation element is heated. The contact elements can be displaced in the same direction here, so that the heated partial portion that is arranged between the contact elements remains constant in each case. This simplifies the electrical control of the activation element.

In one embodiment of the invention, the contact element may comprise a plurality of contact pins, which are arranged along the longitudinal extent of the activation element and can be moved toward the activation element. In this way, the contact element does not necessarily have to be moved in the direction of the longitudinal extent of the activation element. Rather, it is sufficient to move at least one contact pin from the plurality of contact pins in a direction of movement which is substantially perpendicular to the longitudinal extent of the activation element toward the activation element or to lift it off from the latter. This allows a locally changing contact point on the activation element to be realized in a simple and reliable way.

In some embodiments of the invention, the activation element may comprise at least one wire. In the sense of the present invention, a wire may have a round, oval or polygonal cross section. In this way, the ratio of surface to volume of the activation element can be increased. In some embodiments of the invention, such an activation element may be guided or deflected by way of at least one roller. The roller may be part of a contact element which at the same time electrically contacts the activation element with a current or voltage source.

BRIEF DESCRIPTION OF THE DRAWINGS

The invention is intended to be explained in more detail below on the basis of exemplary embodiments and figures, without restricting the general concept of the invention. In the figures.

DESCRIPTION OF PREFERRED EMBODIMENTS

Figure 1:
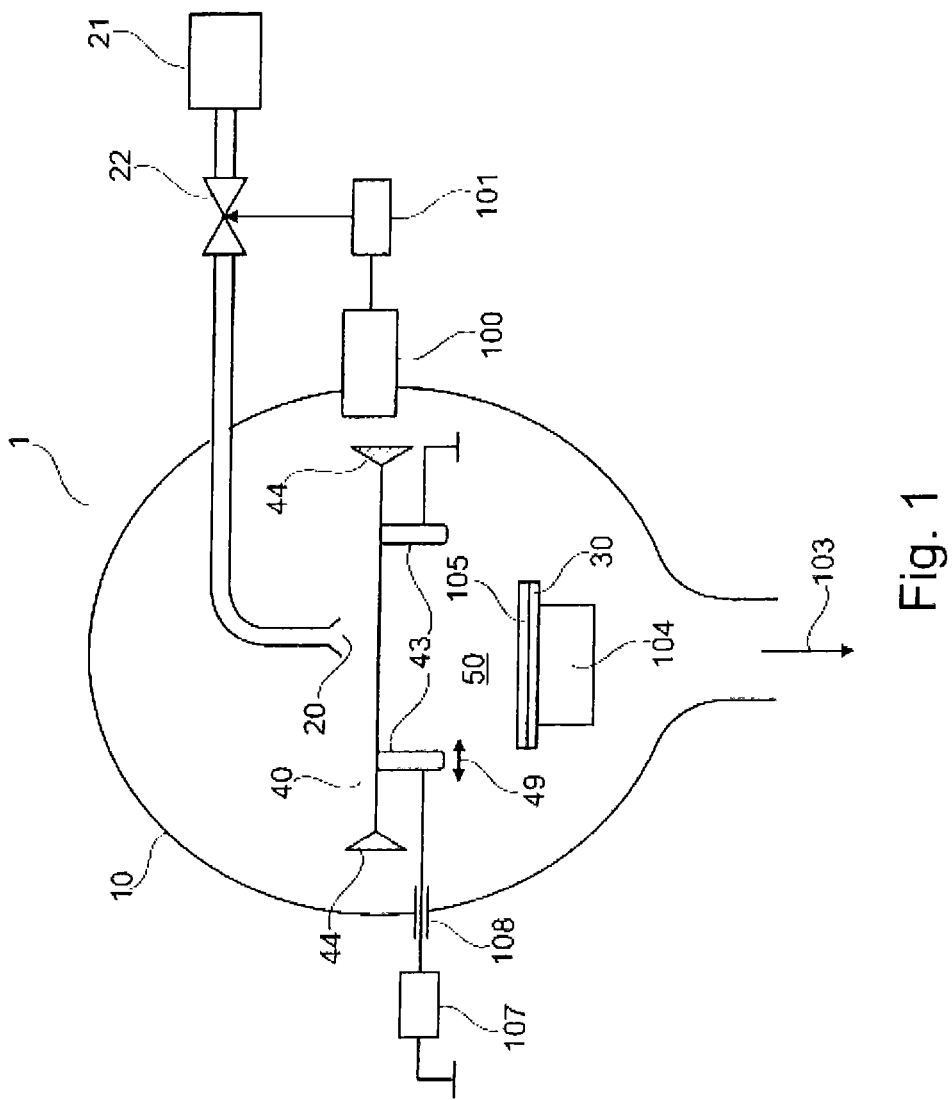
FIG. 1 shows the basic structure of a coating device according to the invention.

FIG. 1 shows a cross section through a coating device 1. The coating device 1 comprises a recipient 10, which is, for example, produced from high-grade steel, aluminum, glass or a combination of these materials. The recipient 10 is closed off from the surroundings in a substantially airtight manner. A vacuum pump (not represented) may be connected by way of a pump flange 103. For example, the recipient 10 may be evacuated to a pressure of less than $10^0$ mbar, less than $10^{-2}$ mbar or less than $10^{-6}$ mbar.

Inside the recipient 10 there is a holding device 104, in which a substrate 30 may be mounted. The substrate 30 may, for example, consist of glass, silicon, plastic, ceramic, metal or an alloy. The substrate may be a semiconductor wafer, a pane or a tool. It may have a planar or curved surface. The materials mentioned are only mentioned here by way of example. The invention does not teach the use of a specific substrate as a principle for providing a solution. During the operation of the coating device 1, a coating 105 is deposited on the substrate 30.

The composition of the coating 105 is influenced by the choice of the gaseous precursor. In one embodiment of the invention, the precursor may comprise methane, so that the coating 105 comprises diamond or diamond-like carbon. In another embodiment of the invention, the precursor may comprise monosilane and/or monogermanium, so that the coating comprises crystalline or amorphous silicon and/or germanium.

The gaseous precursor is introduced into the interior of the recipient 10 by way of at least one gas supply device 20. The gas supply device 20 obtains the gaseous precursor from a storage vessel 21. The amount of precursor taken from the storage vessel 21 can be influenced by way of a control valve 22. If the coating 105 is made up of a number of different precursors, the storage vessel 21 may comprise a prepared gas mixture, or else a number of gas supply devices 20 may be provided, each introducing a component of the made-up precursor into the recipient 10.

The amount of precursor supplied to the gas supply device 20 by way of the control valve 22 is monitored by way of a control device 101. The control device 101 is supplied with an actual value of a partial or absolute pressure by a measuring device 100.

For the activation of the gaseous precursor, an activation device 40 is available. The activation element 40 comprises one or more catalytically active surfaces, for example in the form of a metal sheet or a wire. For example, the activation element 40 may comprise tungsten, molybdenum, and niobium and/or tantalum.

The activation element 40 is fastened to at least one holding element 44. The holding element 44 fixes the activation element 40 at a predeterminable position and/or with a predeterminable mechanical stress. At least one holding element 44 may be configured in an electrically insulated manner, in order to bring the activation element at least partially to a predeterminable electrical potential.

During the operation of the activation element, there forms inside the recipient 10 an active zone 50, in which disassociated and/or excited constituents of the precursor are detectable. The activity of the surface of the activation element 40 is achieved at an elevated temperature in comparison with room temperature. For the heating of the activation element 40, it is envisaged according to FIG. 1 to provide at least two electrical contact elements 43. By means of the contact elements 43 at least one end of the activation element may be connected to a power source 107 by means of a vacuum-tight leadthrough 108. In this case, the heating of the activation element 40 is performed by resistance heating. If the activation element consists of a homogeneous material and has a uniform thickness, the heating power E introduced along the longitudinal extent x of the activation element is constant:

$$\frac{\partial E}{\partial x} = const.$$

On account of the heat conduction and/or heat radiation of the holding elements 44 and/or the contact elements 43, the temperature of the activation element 40 decreases from the geometrical center to the periphery if the heating power is substantially constant over the length of the wire. In this case, a temperature at which the material of the activation element 40 is reacted at an accelerated rate with the gaseous precursor to form undesired phases, for example carbides and/or silicides and/or germanides, may be established near the contact element 43.

In order to minimize the harmful influence of the precursor on the activation element, it is proposed according to FIG. 1 to use an activation element 40 of which the geometrical dimensions are greater than the dimensions of the active zone 50. The activation element 40 is mounted inside the recipient 10 in an electrically insulated manner by means of the holding elements 44. The two contact elements 43 lie in contact with the activation element 40, for example, by way of rollers, rolls, sliding contacts or similar elements.

The contact elements 43 are movable along a transporting direction 49, which runs along the longitudinal extent of the activation element 40. In the embodiment represented in FIG. 1, both contact elements 43 are moved along the activation element 40. In this case, the movement may take place in the same direction, so that the portion of the activation element 40 that is confined between the contact elements 43 remains approximately constant, or else the movement takes place in opposite directions or in an uncorrelated manner, so that the portion that is confined by the contact elements 43 is laterally variable. The movement of the contact elements 43 along the transporting direction 49 may be harmonic or anharmonic, and take place continuously or with intermittent breaks.

The movement of the contact elements 43 has the effect that the location of lower temperature that forms near the contact point of the contact element 43 on the activation element 40 is locally variable. In this way, the harmful influence of the precursor on the activation element 40 is distributed over a greater surface area of the activation element, so that the overall lifetime of the activation element is increased. In some embodiments of the invention, it may additionally be provided that a region that is damaged in the presence of the precursor at low temperatures is regenerated again by increasing the temperature when moving the contact element 43 away, in that the undesired phases of the activation element 40 undergo a renewed reaction.

Figure 2:
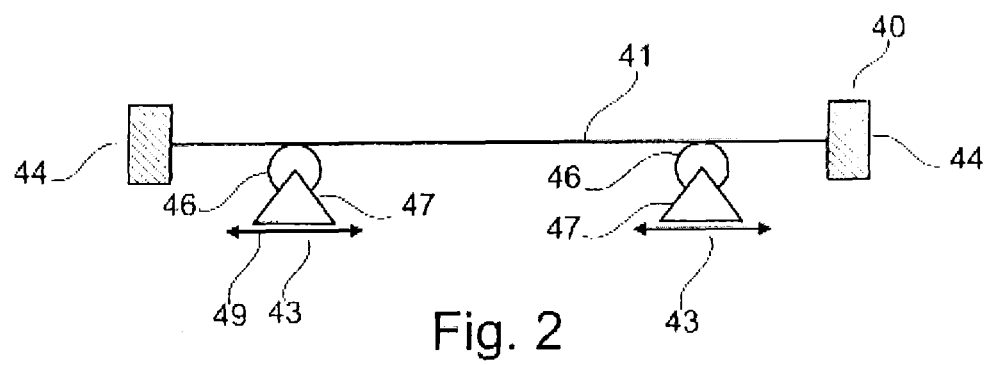
FIG. 2 illustrates an exemplary embodiment of the activation element proposed according to the invention.

FIG. 2 shows an exemplary embodiment of an activation element 40 in a more detailed representation. In this embodiment of the invention, the active surface of the activation element 40 is formed by a wire 41, which, for example, comprises tungsten, niobium, molybdenum or tantalum. FIG. 2 also shows two holding elements 44, between which the activation element 40 is fixed. The holding elements 44 can receive the activation element 40 in an insulated manner. The fastening of the activation element on the holding elements 44 may be performed, for example, by clamping, welding or else by a spring. In this way, the mechanical stress in the activation element 40 can be kept constant.

For the contacting of the wire 41, two contact elements 43 are available and are kept at different electric potential. The different potential has the effect that an electric current which may serve for heating the wire 41 flows through the wire 41 between the contact elements 43. The electrical contact between the wire 41 and the contact element 43 is made by a roller 46. The roller 46 is rotatably mounted in a roller carrier 47. The roller 46 may have along its circumferential surface a groove which can receive the wire 41 and ensures a reliable electrical contact without the wire 41 running off the roller 46. A material which combines good electrical conductivity with poor thermal conductivity, for example high-grade steel, may be used for the roller 46.

The roller carrier 47 is moved along a transporting direction 49, which runs substantially parallel to the wire 41. For this purpose, the roller carrier 47 may, for example, be guided by means of a rail, a pillar guide, a toothed rack or a threaded rod. The movement of the roller carrier 47 may take place in changing directions or unidirectionally from one end of the activation element 40 to the other end.

Figure 3:
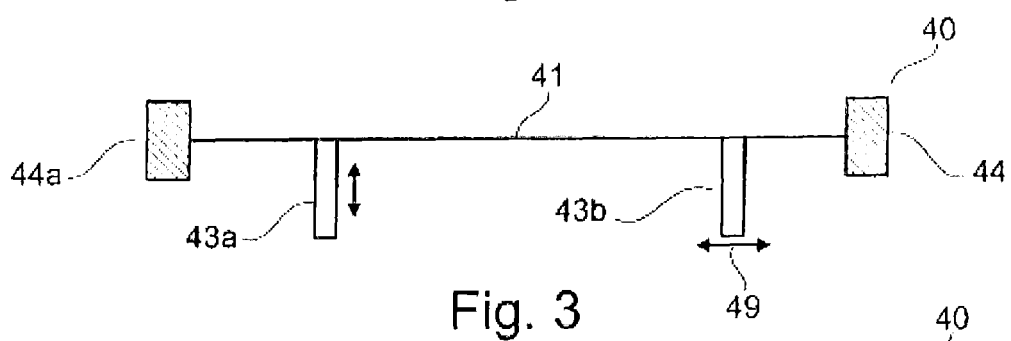
FIG. 3 shows a further exemplary embodiment of an activation element proposed according to the invention.

A further exemplary embodiment of an activation element 40 is represented in FIG. 3. FIG. 3 shows once again a wire 41, which is mechanically fixed by means of two holding elements 44. Lying against the wire 41 are two contact elements 43, which have, for example, a sliding contact. The sliding contact may, for example, be guided by spring force against the wire 41, in order to ensure a constant pressing force.

According to FIG. 3, a contact element 43b is guided along the direction of movement 49 parallel to the wire 41. In this way, the contact point can be displaced along the wire 41, so that the partial portion with the lowest temperature varies along the wire 41.

The contact element 43a represented on the left in FIG. 3 is moved in a direction which runs approximately perpendicular to the longitudinal extent of the wire 41. In this way, the contact element 43 can either touch or not touch the wire 41. If the contact element 43 has been lifted off from the wire 41, the circuit is taken off by way of the electrically conductive holding element 44a. In this way, the contact point on the wire 41 can be discretely changed, to be specific either at the end point of the holding element 44a or at the tap of the contact element 43a.

Figure 4:
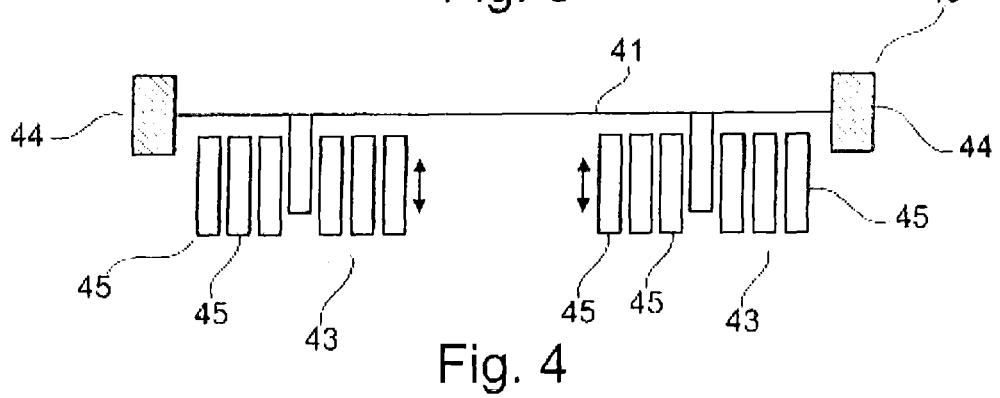
FIG. 4 shows two contact elements, which each comprise a plurality of contact pins.

FIG. 4 shows two contact elements 43, which each comprise a plurality of contact pins 45. The contact pins 45 are arranged along the longitudinal extent of the activation element 40 or of the wire 41. The contact pins 45 are mounted displaceably along a direction of movement which runs approximately orthogonal to the longitudinal extent of the wire 41. The contact pins 45 can be guided along this direction of movement, for example, by spring force against the wire 41. By moving at least one contact pin, the location of the contacting on the wire 41 can be varied in discrete steps. Contact pins 45 that are not required can be lifted off from the wire 41, so that they do not represent a heat bridge. In this way, the temperature of the wire 41 can be kept under control in such a way that undesired, harmful phases cannot form in a short time at one point.

It goes without saying that the features represented in FIGS. 2 to 4 may also be combined in order in this way to obtain further embodiments of the activation element according to the invention. Therefore, the above description should not be regarded as restrictive, but as explanatory. The claims which follow should be understood as meaning that a feature which is mentioned is present in at least one embodiment of the invention. This does not exclude the presence of further features. Wherever the claims define "first" and "second" features, this designation serves for distinguishing between two identical features, without giving them any priority.

The invention claimed is:

1. A coating device, comprising at least one vacuum chamber, the vacuum chamber being adapted to be evacuated and being adapted to receiving a substrate, at least one gas supply device, by means of which at least one gaseous precursor can be introduced into the vacuum chamber, and at least one heatable activation element, the heatable activation element being a predeterminable longitudinal extent and being fastened immovably in relation to the vacuum chamber by means of at least two dedicated mechanical fastening devices, wherein an electrical current can be supplied to the activation element by way of at least two contact elements, at least one of the contact elements being designed to contact the activation element at changing contact positions between the at least two fastening devices.

2. The coating device according to claim 1, wherein the contact element comprises a plurality of contact pins, which are arranged along the longitudinal extent of the activation element and can be moved toward the activation element.

3. The coating device according to claim 1, wherein the activation element comprises at least one wire.

4. The coating device according to claim 1, wherein the contact element comprises at least one roller, which is provided for the purpose of being in contact with the activation element.

5. The coating device according to claim 4, wherein the wire is led repeatedly through the active zone.

6. The coating device according to claim 1, wherein a plurality of contact elements to which a predeterminable electrical potential difference can be respectively applied are arranged along the longitudinal extent of the activation element.

7. The coating device according to claim 1, wherein the mechanical fastening device is electrically insulated.

8. A coating device, comprising at least one vacuum chamber, the vacuum chamber being adapted to be evacuated and being adapted to recieve a substrate, at least one gas supply device, by means of which at least one gaseous precursor can be introduced into the vacuum chamber, and at least one heatable activation element, the heatable activation element having a predeterminable longitudinal extent and being fastened immovably in relation to the vacuum chamber by at least two dedicated mechanical fastening devices, wherein an electrical current can be supplied to the activation element by way of at least two contact elements, at least one of the contact elements being designed to contact the activation element at changing contact positions between the at least two fastening devices, wherein the contact element comprises a plurality of contact pins, which are arranged along the longitudinal extent of the activation element and can be moved toward the activation element.

9. The coating device according to claim 8, wherein the activation element comprises at least one wire.

10. The coating device according to claim 8, wherein the contact element comprises at least one roller, which is provided for the purpose of being in contact with the activation element.

11. The coating device according to claim 8, wherein the wire is led repeatedly through the active zone.

12. The coating device according to claim 8, wherein a plurality of contact elements to which a predeterminable electrical potential difference can be respectively applied are arranged along the longitudinal extent of the activation element.

13. A method for producing a coating of a substrate by using the coating device of claim 1 or claim 8, comprising the following steps:
   introducing the substrate into a vacuum chamber,
   evacuating the vacuum chamber,
   introducing at least one gaseous precursor into the vacuum chamber by means of at least one gas supply device,
   activating the precursor by means of at least one heated activation element, wherein an electrical current is supplied to the activation element by means of at least two contact elements, wherein
   the activation element is arranged fixedly in the vacuum chamber by at least two fastening devices, and at least one contact element contacts the activation element at changing contact positions between the at least two fastening devices.

14. The method according to claim 13, wherein the contact positions are changed in an oscillating manner.

15. The method according to claim 13, wherein the contact element comprises a plurality of contact pins, which are arranged along the longitudinal extent of the activation element and are alternately moved toward the activation element.

16. The method according to claim 13, wherein the activation element comprises at least one wire.

17. The method according to claim 16, wherein the wire is led repeatedly through the active zone.

18. The method according to claim 13, wherein a plurality of contact elements along the longitudinal extent of the activation element are in contact with the latter and a predeterminable electrical potential difference is applied to each contact element.

* * * * *